US007620853B1

(12) United States Patent
Kasnavi et al.

(10) Patent No.: US 7,620,853 B1
(45) Date of Patent: Nov. 17, 2009

(54) METHODS FOR DETECTING RESISTIVE BRIDGING FAULTS AT CONFIGURATION RANDOM-ACCESS MEMORY OUTPUT NODES

(75) Inventors: Zunhang Yu Kasnavi, Sunnyvale, CA (US); Eng Ling Ho, Simpang Ampat (MY)

(73) Assignee: Altera Corporation, San Jose, CA (US)

( * ) Notice: Subject to any disclaimer, the term of this patent is extended or adjusted under 35 U.S.C. 154(b) by 401 days.

(21) Appl. No.: 11/714,641

(22) Filed: Mar. 5, 2007

(51) Int. Cl.
*G06F 11/00* (2006.01)

(52) U.S. Cl. .................. 714/42; 714/725; 714/719; 716/16; 716/4

(58) Field of Classification Search .............. None
See application file for complete search history.

(56) References Cited

U.S. PATENT DOCUMENTS

| | | | |
|---|---|---|---|
| 6,477,673 B1 * | 11/2002 | Ferrant et al. | 714/728 |
| 6,725,442 B1 * | 4/2004 | Cote et al. | 716/16 |
| 6,889,368 B1 | 5/2005 | Mark et al. | |
| 6,920,621 B1 | 7/2005 | Toutounchi et al. | |
| 7,062,685 B1 | 6/2006 | Plofsky et al. | |
| 7,111,214 B1 | 9/2006 | Chaudhary et al. | |
| 7,162,660 B2 | 1/2007 | Ogino | |
| 2005/0240887 A1 * | 10/2005 | Rajski et al. | 716/4 |
| 2008/0262761 A1 * | 10/2008 | Nozuyama | 702/59 |
| 2008/0294953 A1 * | 11/2008 | Cheng et al. | 714/726 |

* cited by examiner

*Primary Examiner*—Christopher S McCarthy
(74) *Attorney, Agent, or Firm*—Treyz Law Group; G. Victor Treyz

(57) ABSTRACT

Integrated circuits such as programmable logic device integrated circuits have configuration random-access memory elements. The configuration random-access memory elements are tested to determine whether any of the elements have resistive bridging faults at their outputs. During testing, a pattern of test configuration data is loaded into the configuration random-access memory elements. The programmable logic device is placed in user mode to clear programmable logic registers on the device. The configuration random-access memory elements are sensitized to the presence of resistive bridging faults by performing read operations. After sensitizing the configuration random-access memory elements, a tester applies test vectors to the programmable logic of the programmable logic device. As the test vectors are applied, the tester observes whether the programmable logic of the device is performing properly or has been affected by the presence of a resistive bridging fault.

20 Claims, 7 Drawing Sheets

METHODS FOR DETECTING RESISTIVE BRIDGING FAULTS AT CONFIGURATION RANDOM-ACCESS MEMORY OUTPUT NODES

BACKGROUND

This invention relates to testing volatile memory elements, and more particularly, to testing configuration random-access memory in integrated circuits such as programmable logic device integrated circuits.

Integrated circuits often contain volatile memory elements. In programmable logic devices, volatile memory elements are used to store configuration data. This type of memory is often referred to as configuration random-access memory (CRAM).

Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the configuration random-access memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Programmable logic devices are tested during manufacturing. Some programmable logic devices contain redundant circuitry. If testing reveals that a device contains a defect, the device can be repaired by switching the redundant circuitry into use. When testing identifies a defect that cannot be repaired, the device may be discarded. After testing and any necessary repairs have been completed, the device can be programmed for normal operation in a system.

Conventional techniques for testing configuration random-access memory elements are generally not able to detect all faults. Some faults, such as those that arise only under certain circuit conditions, may therefore go undetected when subjected to conventional testing.

It would therefore be desirable to be able to provide improved techniques for testing configuration random-access memory on integrated circuits such as programmable logic device integrated circuits.

SUMMARY

In accordance with the present invention, configuration random-access memory elements are tested for resistive bridging faults at their outputs. The configuration random-access memory elements may be provided in an array on an integrated circuit such as a programmable logic device. During normal operation, configuration data that has been loaded into the configuration random-access memory elements configures programmable logic on the programmable logic device to perform a desired custom logic function.

Resistive bridging faults at the outputs of the configuration random-access memory elements can be detected during user mode testing. A pattern of test configuration data is loaded into the array of memory elements. The pattern generally contains some ones and some zeros.

Configuration random-access memory elements produce static output control signals that are applied to the gates of corresponding transistors in the programmable logic. This turns the transistors on and off and configures the logic as needed.

Each configuration random-access memory element has an output line that is connected to the gate of a corresponding transistor. If there is a resistive fault that connects the output line to a source-drain terminal or body terminal of the corresponding transistor, the configuration random-access memory element is said to have a resistive bridging fault.

To detect the resistive bridging fault, registers in programmable logic on the device are cleared. This takes nodes in the device such as the node that is connected to the resistive bridging fault to zero.

The array is then sensitized to the presence of resistive bridging faults by performing read operations on the configuration random-access memory elements. If a configuration random-access memory element that has been loaded with a one and that has a resistive bridging fault is exposed to a read operation, the loaded one will erroneously flip to a zero.

To detect flipped configuration random-access memory bits, a tester applies test vectors to the programmable logic of the device and monitors the results. By comparing measured signals to expected signals, the tester can determine whether any of the configuration random-access memory elements have had their state erroneously flipped during the sensitization operation.

When a resistive bridging error is detected, appropriate actions can be taken such as discarding the programmable logic device, performing failure analysis, etc.

Further features of the invention, its nature and various advantages will be more apparent from the accompanying drawings and the following detailed description of the preferred embodiments.

DETAILED DESCRIPTION

The present invention relates to memory elements such as configuration random-access memory elements for integrated circuits such as programmable logic device integrated circuits. If desired, the memory elements may be formed on other integrated circuits, such as digital signal processing circuits with arrays of memory elements, microprocessors with memory elements, application specific integrated circuits with memory elements, etc. For clarity, the present invention will generally be described in the context of programmable logic device integrated circuits and programmable logic device configuration random-access memory elements.

Figure 1:
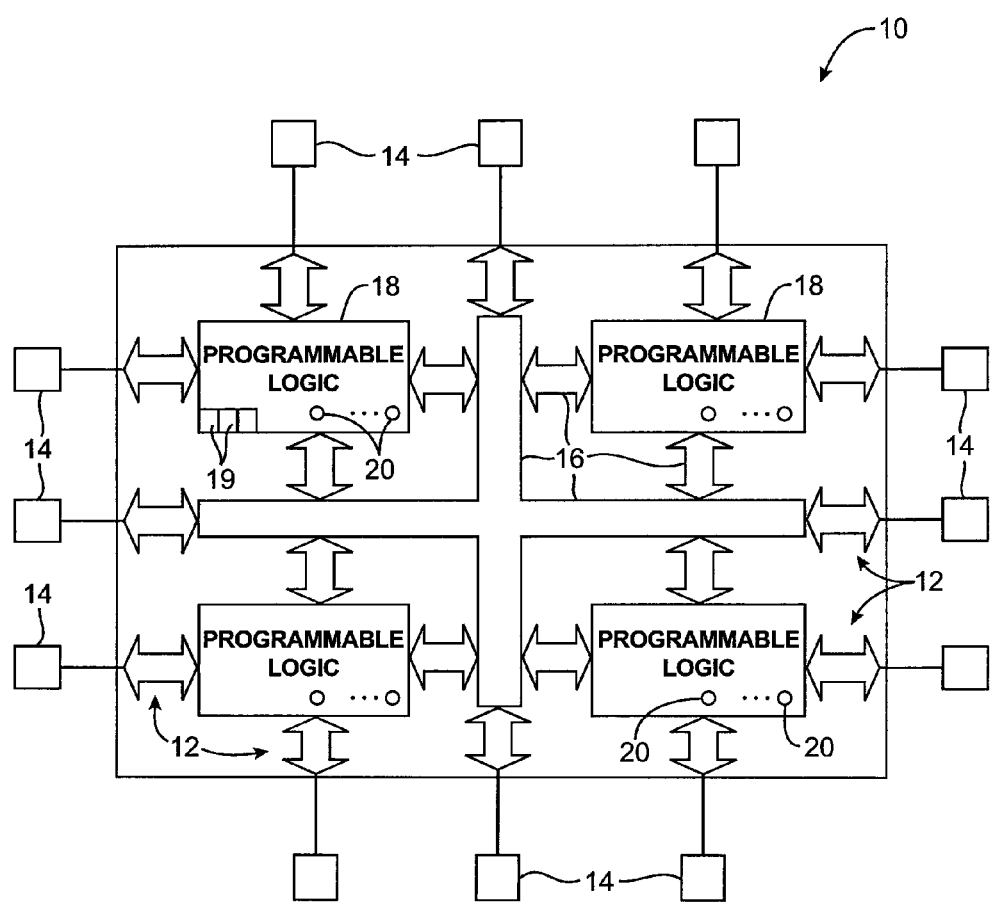
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers, logic gates such as AND gates, NAND gates, etc. When a memory element output that is associated with an NMOS pass transistor is high, the pass transistor controlled by that memory element is turned on and passes logic signals from its input to its output. When the memory element output is low, the pass transistor is turned off and does not pass logic signals. P-channel metal-oxide-semiconductor transistors can also be controlled by memory element output signals.

Memory elements 20 may be formed using complementary metal-oxide-semiconductor (CMOS) integrated circuit technology (as an example). In the context of programmable logic device integrated circuits, the memory elements store configuration data and are therefore sometimes referred to as configuration random-access memory (CRAM) cells.

Configuration random-access memory elements 20 are generally arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control (e.g., turn on and off) portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions (sometimes referred to as logic array blocks) each of which contains multiple smaller logic regions 19 (sometimes referred to as logic elements). A typical logic element 19 may contain a look-up table, multiplexer logic, and a register.

The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
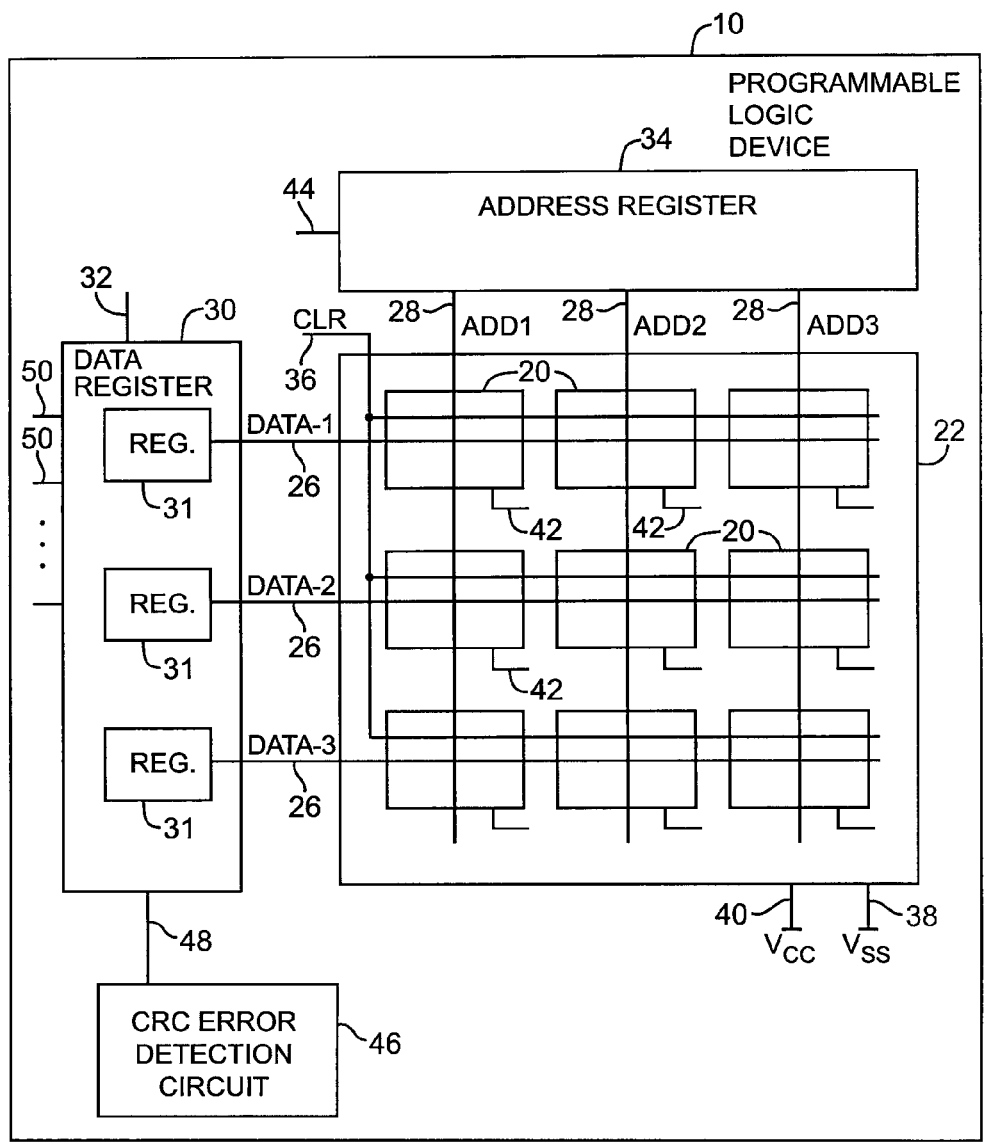
FIG. 2 is a diagram of an array of programmable logic device configuration random-access memory elements in accordance with an embodiment of the present invention.

An illustrative data loading arrangement that may be used to load an array of configuration random-access memory elements 20 on a programmable logic device 10 is shown in FIG. 2. The arrangement of FIG. 2 has a 3×3 array 22 of memory elements 20. Actual memory arrays typically have hundreds or thousands of rows and columns. The 3×3 array of FIG. 2 is used as an example.

Array 22 receives power via positive power supply line 40 and ground line 38. The ground voltage Vss on ground line 38 is typically 0 volts. A positive power supply voltage Vcc may be applied to positive power supply line 40. The voltage Vcc may also be used to power core logic in device 10. If desired, Vcc may be elevated with respect to the core logic power supply voltage.

A clear line 36 (labeled CLR) may be used to clear the contents of the memory array 22. After the array has been cleared, configuration data may be loaded.

Configuration data may be provided to data registers 30 via input 32. The configuration data may then be provided to array 22 via data registers 31 and the DATA_IN_1, DATA_IN_2, and DATA_IN_3 lines 26.

Address register 34 receives addressing information via input 44. In operation, the address register asserts a desired one of the address lines 28 (i.e., ADD1, ADD2, or ADD3). When an address line is asserted in a given column, the data on the data lines 26 is loaded into the memory elements 24 in that column. The array may be filled by systematically loading the memory elements in each of the columns of the array. After the array has been completely loaded with configuration data, the output 42 of each memory element 24 produces a corresponding static control signal for controlling the gate of a pass transistor or other logic component on the programmable logic device.

Cyclic redundancy check (CRC) error detection circuit 46 is a type of error correction code (ECC) error detection circuit that may be used to check whether there are any errors in the loaded configuration data. In a typical scenario, a user implements a logic design in programmable logic device 10 by loading configuration data into array 22. During operation of device 10, the contents of array 22 is read from array 22 by loading array data into data register 30 in parallel over lines 26 one column at a time. The captured columns of configuration data are continuously shifted out of data register 30 and through CRC error detection circuit 46 over a path such as path 48. The configuration data typically includes a CRC signature. The CRC error detection circuit performs computations on the configuration data and compares against an expected CRC signature to detect errors. If an error is detected, a fresh set of configuration data can be loaded into array 22 (e.g., from an associated configuration data loading circuit).

The process of shifting the configuration data in series through CRC detection circuit 46 is time consuming. In a normal operating environment, in which device 10 is installed in a system, it is not burdensome to shift the configuration data in series through CRC detection circuit 46, because the shifting operation is part of a continuous error detection process that is running in the background while the programmable logic of device 10 performs its intended function.

However, when testing devices as part of a manufacturing process, the need to use CRC detection circuit 46 to serially process configuration data can be inefficient. At least partly as a result of the need for greater efficiency, conventional programmable logic devices may support parallel unloading of CRAM array data registers. In a typical arrangement, a programmable logic device may be placed in test mode or user mode. In test mode, output drivers associated with logic element registers on the device are tristated using freeze signals. Configuration data may be captured from the configuration random-access memory array in parallel and provided to an external tester for analysis. In user mode, the freeze signals are disabled, so that the logic element registers can drive associated interconnects. During user mode, test configuration data may be loaded into the CRAM array while registers in the logic elements on the device are supplied with test settings either by loading test vectors through a scan chain or by applying test vectors to the pins of the device under test and routing the test vectors as needed by appropriate configuration of the interconnects on the device.

The illustrative programmable logic device 10 of FIG. 2 may be operated in user mode or test mode. In test mode, lines 50 may be used to communicate in parallel with data register 30. All internal nodes are pulled high by freeze signals.

Figure 3:
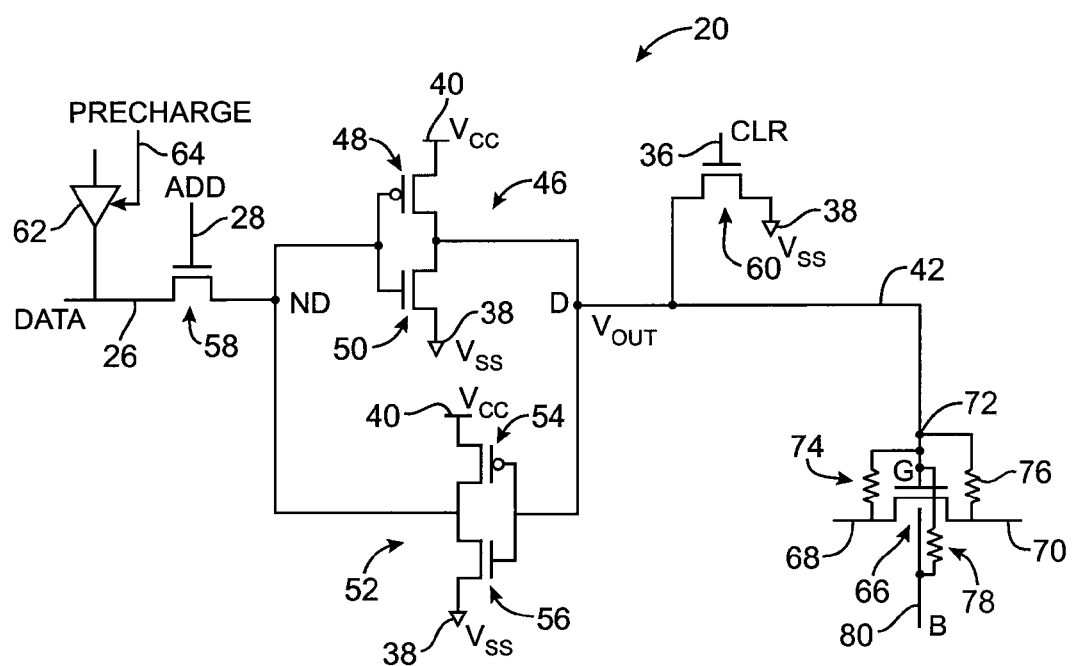
FIG. 3 is a diagram of an illustrative configuration random-access memory element in accordance with an embodiment of the invention that has a resistive fault at its output node.

Certain types of faults, such as resistive bridges at a configuration random-access memory element output, may be difficult to detect during test mode. Consider, as an example, the configuration random-access memory element of FIG. 3. Memory element 20 of FIG. 3 is formed from two cross-coupled inverters—inverter 46 and inverter 52. Inverter 46 has a p-channel metal-oxide-semiconductor (PMOS) transistor 48 and an n-channel metal-oxide-semiconductor (NMOS) transistor 50. Inverter 52 has PMOS transistor 54 and NMOS transistor 56. An NMOS transistor 60 may serve as a clear transistor. Transistor 60 may be turned on during clear operations by activating clear line 36. This connects data node D to ground 38 and clears the memory element 20.

The output of the memory element on line 42 (Vout) is determined by the signal on node D. When D is high (e.g., at Vcc) and inverse data node ND is low, element 20 is said to contain a logic one. When D is low and ND is high, element 20 is said to contain a logic zero.

When address line 28 is taken high, NMOS address transistor 58 is turned on and the signal on data line 26 is driven into the memory element 20. A precharge driver 62 may be used to precharge the signal on line 26 to a logic high. Control line 64 may be used to tristate the driver 62 when not in use.

During loading, if the signal on line 26 is high, node ND is held high and the memory element 20 remains in its low (cleared) state. The output voltage Vout in this situation is low. If the signal on line 26 is low, node ND is taken low and, due to the inversion of the low ND signal by inverter 46, the voltage on node D is taken high. This makes the output voltage Vout high.

The output 42 of memory element 20 is generally connected to the gate of a transistor in a multiplexer, an AND gate, an OR gate, or other suitable logic gate in the programmable interconnect logic or other programmable logic of programmable logic device 10. As shown in FIG. 3, the output of the memory element 20 may be applied to the gate of an n-channel MOS pass gate transistor such as transistor 66. In this type of situation, transistor 66 should be turned off when Vout is low and should be turned on when Vout is high.

In the example of FIG. 3, transistor 66 is bridged by a resistive fault. Transistor 66 has source and drain terminals 68 and 70. The source and drains of the memory element transistors such as transistor 66 are sometimes collectively referred to as source-drain terminals. Transistor 66 also as a gate terminal 72 and a body terminal 80. Due to fabrication errors, a resistive element is formed across at least one pair of the terminals of transistor 66. Three possibilities are illustrated in FIG. 3. A resistive fault 74 may be present that that connects terminals 72 and 68, a resistive fault 78 may be present that connects terminals 72 and 80, or a resistive fault 76 may be present that connects terminals 72 and 70. In each of these situations, the gate G of transistor 66 is bridged by an unwanted resistive connection. Typically there will only be one such fault in a given transistor. The present invention will sometimes be described in the context of a fault represented by resistor 74 for specificity.

The behavior of the transistors in memory element 20 depends on the value of the resistance of the resistive fault. If the resistive fault has a high resistance, for example, it may be difficult to detect its presence. A resistive fault with a low resistance is generally easier to detect, because a low resistance bridging resistor at the output of memory element 20 may readily cause the contents of element 20 to flip from its proper value to an erroneous inverted value.

The mode in which programmable logic device 10 is operating also affects the ability of a tester to determine whether or not resistive bridging is present at the output of memory element 20. During test mode, internal nodes in programmable logic device 10 such as node 68 are biased to Vcc (e.g., 1.0 volts, 1.2 volts, or other suitable voltage levels). The biasing of the internal nodes may, as an example, be performed by power-on-reset logic in device 10 during power up.

During testing, a logic zero may be written into memory element 20 by taking node ND high (e.g., by supplying a high signal on line 26 and by asserting address line 28 to turn on address transistor 58). When node ND is taken high, inverter 46 should produce a corresponding low output signal on node D, so that a logic zero is stored on node D. In this type of situation, transistor 48 should be off, transistor 50 should be on, transistor 54 should be on, and transistor 56 should be off.

Due to the presence of resistive fault 74, the voltage Vout on node D will be pulled toward the high voltage (Vcc) that is present on internal node 68. Transistor 50 and resistive fault 74 form a voltage divider circuit. If the resistance of transistor 50 is r and the resistance of resistive fault 74 is R, the voltage Vout will be approximately equal to $Vcc*r/(r+R)$. So long as Vout remains below the threshold voltage Vth of transistor 56, the output of inverter 52 will be high. If, however, the resistance of resistive fault 74 is sufficiently low (e.g., R is equal to a low resistance R1), the voltage pull-up behavior of resistive fault 74 will be stronger than the voltage pull-down behavior of inverter 46. As a result, the value of D will be pulled high in error. Once Vout rises above the threshold voltage Vth of transistor 56, the output of inverter 52 will go low, pulling node ND low in error.

In this type of situation, the erroneous high value of D can be detected by reading out the contents of memory element 20. In particular, when address line 28 is asserted to turn on address transistor 58, the low ND voltage will be conveyed to data registers 30 (FIG. 2) via data line 26.

Not all faults can be detected in this way. Consider, as an example, a resistive fault that has a higher resistance R2. Because R2 is larger than R1, the voltage Vout will rise to a value $Vcc*r/(r+R2)$. This value is smaller than the amount that voltage Vout rose in response to smaller resistive fault R1. If R2 is sufficiently large, the value of Vcc*r/(r+R2) will be smaller than the threshold voltage Vth of transistor 56 and transistor 56 will not turn on and pull node ND to zero. In this situation, the pull-up effect on the output voltage Vout is insufficient to change its state, provided that memory element 20 is tested in test mode (i.e., a situation in which source-drain terminal 68 of transistor 66 is raised to a logic high value).

However, when device 10 is operated in user mode, the voltage on internal node 68 might be 0 volts (Vss). A logic one may then be written into memory element 20 by driving a zero onto node ND (e.g., by taking the signal on data line 26 to zero and asserting address line 28). In this situation, transistor 48 is on, transistor 50 is off, and node D is high. With node D high, transistor 54 is off and transistor 56 is on. The resistance r of transistor 48 and the resistance R2 of resistive fault 74 form a voltage divider circuit in which the voltage Vout is approximately equal to Vcc*R2/(R2+r). Because R2 is relatively large (in this example), the value of R2/(R2+r) is close to one and Vout is nearly equal to Vcc.

Suppose, however, that it is desired to read the stored configuration bit from the memory element 20 after the logic one value has been written. This type of read operation may be required for routine verification operations such as CRC signature checking. If array 22 is operating properly, the read operation should not disturb the contents of memory element 20. During a typical read sequence, precharge line 64 is used to direct precharge driver 62 to precharge data line 26 high to a logic one value. The precharging operation is used to improve the reliability of memory elements 20 and places data lines 26 in a known state prior to data capture. After precharging data line 26, address line 28 is asserted.

The memory elements in array 22 are designed so that if node ND is low and node D is high (i.e., a logic one is being stored), the presence of the high precharge signal on node ND should not flip output node D from one to zero. In the current example, however, the low voltage on source-drain terminal 68 of transistor 66 and the presence of resistive fault 74 pull the value of D low. Transistor 48, resistive fault 74, and transistor 50 form a resistive network. As described in connection with writing the logic one into memory element 20, transistor 48 and resistive fault 74 form a voltage divider. Transistor 48 has a resistance r and fault 74 has a resistance R2. Due to the precharge voltage on data line 26, transistor 50 is at least partly on. As a result, the resistance r' of transistor 50 should also be taken into account. The resistance r' and the resistance R2 form parallel paths from data node D to ground Vss (through resistor 50 and resistive fault 74, respectively). Due to the presence of the resistance r', the resistance of this parallel path is lower than the resistance of resistive fault 74 taken alone. This pulls the voltage Vout low and creates an error in the output signal of memory element 20.

Figure 4:
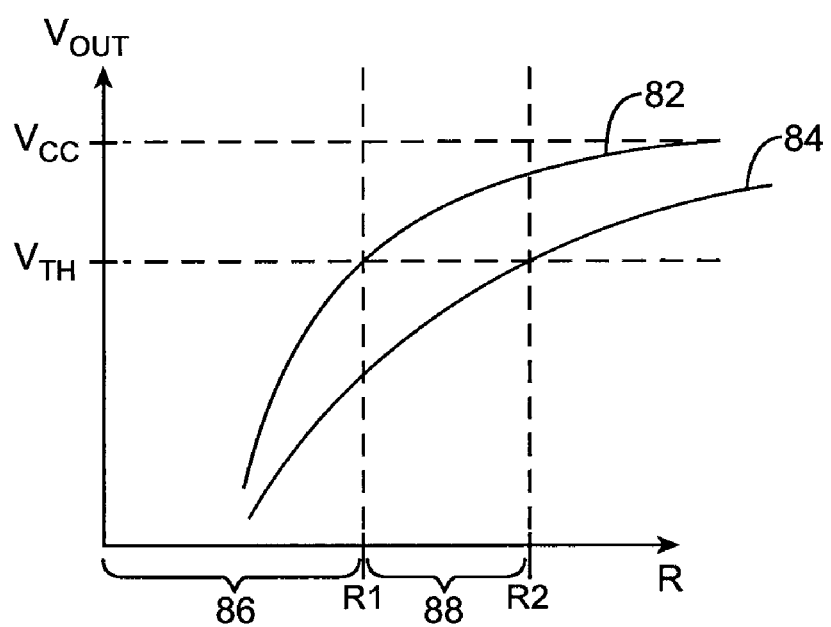
FIG. 4 is a graph showing how a configuration random-access memory element may respond under various circuit conditions in accordance with an embodiment of the present invention.

A graph showing how the behavior of the circuit of FIG. 4 is affected by the presence of a precharged data line during read operations is shown in FIG. 4. In the graph, the voltage of node D (Vout) is plotted as a function of the resistance of a resistive bridging fault such as fault 74 of FIG. 3 for the situation in which a logic one is nominally being stored in memory element 20 and internal node 68 is low (i.e., device 10 is being tested or used in user mode). Line 82 is a voltage transfer curve that represents the behavior of voltage Vout when address line 28 is low. When line 28 is low, address transistor 58 is off and the voltage on line 26 does not affect the voltage Vout. Line 84 is a voltage transfer curve that represents the behavior of voltage Vout when both address line 28 and precharged data line 26 are high.

As described in connection with FIG. 3, when address line 28 and precharged data line 26 are high during a read operation, transistor 50 tends to turn on, pulling Vout lower than when address line 28 is low. Line 84 therefore exhibits lower Vout values for a given fault resistance than line 82. The horizontal dotted line labeled Vth represents the Vout voltage at which inverter 54 will change its state. At voltages Vout above Vth, transistor 56 is on and transistor 54 is off. In this situation, the high Vout signal on node D will properly result in node ND being driven low. The state of memory element 20 (D is a logic one) will remain unchanged. At voltages Vout that are below Vth, however, transistor 56 will start to turn off and transistor 54 will start to turn on. In this situation, the output of inverter 52 will be driven high, rather than being driven low, thereby erroneously flipping the state of memory element 20 so that D is erroneously changed to a logic zero.

As shown by line 82 in the graph of FIG. 4, if the address line 28 is low, only resistances of less than R1 will cause Vout to drop below threshold Vth. As a result, testing with address line 28 low will only reveal faults in region 86. If the address line 28 and precharged data line 26 are high, however, fault resistances of less than R2 will cause Vout to drop below threshold Vth, so faults in both region 86 and 88 will be detected. The process of reading the contents of a configuration random-access memory bit therefore sensitizes the configuration random-access memory bit and makes it possible to detect resistive bridging faults that would otherwise be undetectable (i.e., faults with resistances R between R1 and R2).

Figure 5:
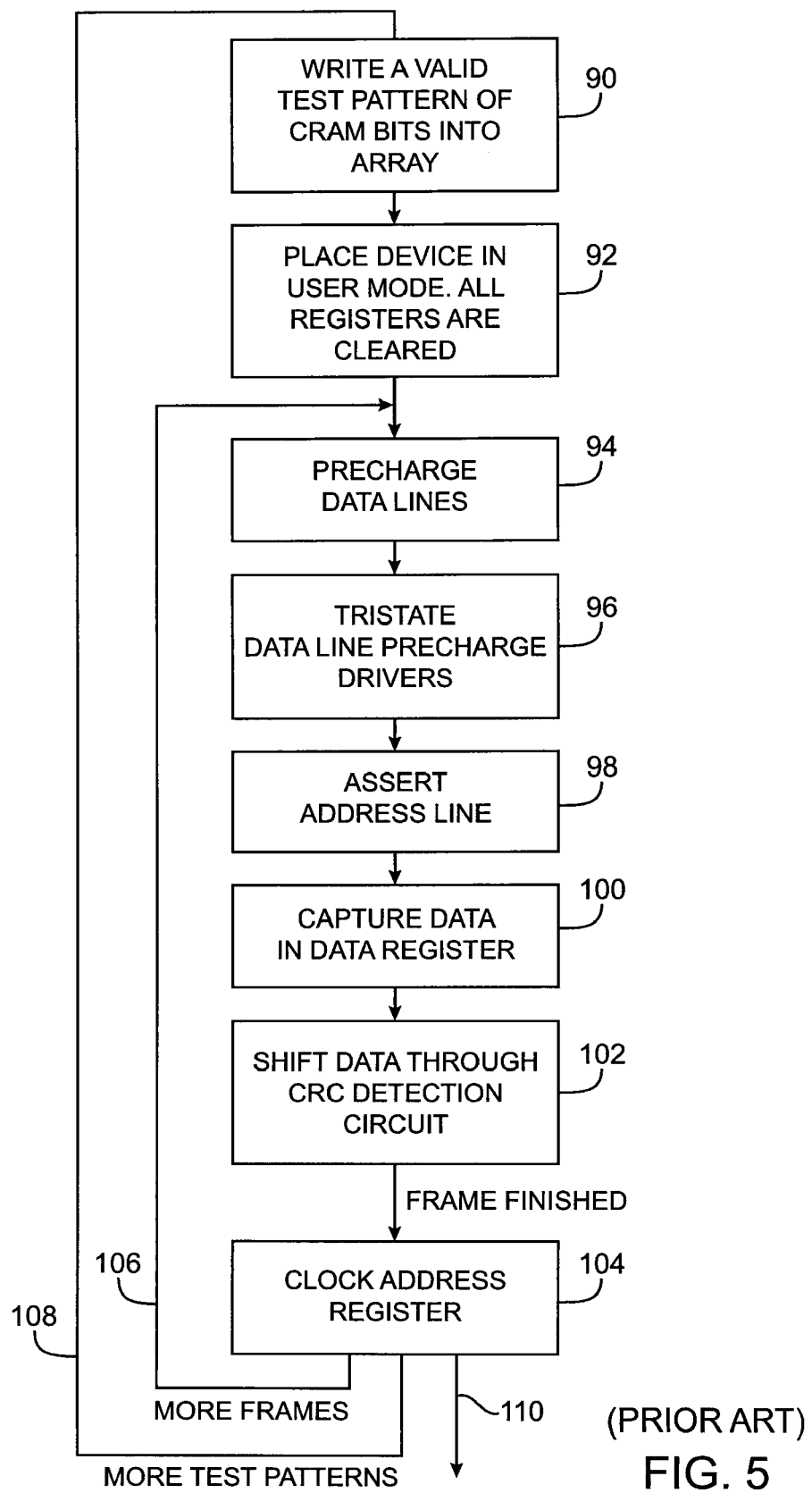
FIG. 5 is a flow chart of a conventional method for testing configuration random-access memory for faults using cyclic redundancy check (CRC) error detection circuitry.

Conventional testing arrangements use CRC error detection circuits such as CRC error detection circuit 46 of FIG. 2 to detect resistive bridging faults at configuration random-access memory element output nodes. A flow chart of steps involved in using a conventional testing arrangement of this type is shown in FIG. 5.

At step 90, a tester is used to write a valid test pattern of configuration random-access memory bits into a CRAM array on a programmable logic device integrated circuit.

At step 92, the programmable logic device integrated circuit is placed in user mode. In user mode, all logic element registers are cleared, taking internal nodes (such as node 68 in device 10 of FIG. 3) low.

Steps 94, 96, and 98 are used to sensitize the CRAM array to resistive bridging faults. At step 94, precharge drivers are used to precharge the CRAM array's data lines to a logic high (Vcc). At step 96, the precharge drivers are tristated. At step 98, the address line associated with a particular column of the CRAM array (sometimes referred to as a frame of the CRAM array) is asserted. As described in connection with FIGS. 3 and 4, if there is a resistive fault bridging the output node of one of the CRAM elements and if that fault has a resistance R less than R2, the state of the CRAM element will flip from its proper value to an erroneous value. Because it is possible to detect the presence of the resistive bridging fault when CRAM elements change their state in this way, the processes of steps 94, 96, and 98 are sometimes collectively referred to as sensitizing the CRAM array.

After the CRAM array has been sensitized, the current frame (i.e., the column of CRAM data that corresponds to the currently asserted address line) is captured in parallel into a data register using a set of parallel data lines (step 100).

At step 102, the captured data is shifted in series through an on-chip CRC error detection circuit. The value of the current address is then incremented by clocking the CRAM array's address register (step 104).

If more frames in the array remain to be processed, processing loops back to step 94, as shown by line 106. As indicated by line 108, testing may be performed using multiple test patterns.

Once testing is complete or a fault has been detected (line 110), appropriate actions can be taken based on the test results. For example, if the CRC error detection circuit indicates that a fault is present in the CRC data, further testing may be performed (e.g., as part of a failure analysis process) or the tested device can be rejected. If the CRC error detection circuit indicates that no faults are present, the tester can be used to perform additional tests. During these tests, the tester loads test configuration data into the CRAM arrays. The tester then applies test vectors using input-output pins and scan chain registers. Test results can be monitored using input-output pins and scan chain registers. Test mode testing can be used to screen for those CRAM defects that are detectable in test mode.

Conventional testing schemes such as the testing arrangement of FIG. 5 can be used to detect resistive bridging at configuration random-access memory element outputs, but can be time consuming due to the use of the CRC error detection circuit and the associated serial shifting of captured data through the data register. The time required to complete this type of test is linearly proportional to the size of the CRAM array and the number of different test configuration data patterns that are required to cover all CRAM bits. For example, a test on a 5 million bit CRAM array that uses 10 test configuration data patterns may require 4 seconds to complete using a 10 MHz tester. In a typical scenario, hundreds of different test configuration data patterns are used. To ensure that test times are not too long, some test patterns may be omitted, which will lead to coverage loss. In addition, redundancy implementation issues pose further challenges. The expected CRC signature may be calculated on die to account for different redundancy information, which will generally require a non-test-mode configuration. This conventional approach can become impractical as programmable logic devices become increasingly complex.

In accordance with the present invention, test time is reduced by bypassing the CRC error detection circuit 46 when performing tests with a tester. The tester does not use CRC error detection circuit 46, but rather performs tests on the operation of the programmable logic to determine whether CRAM bits contain faults.

Figure 6:
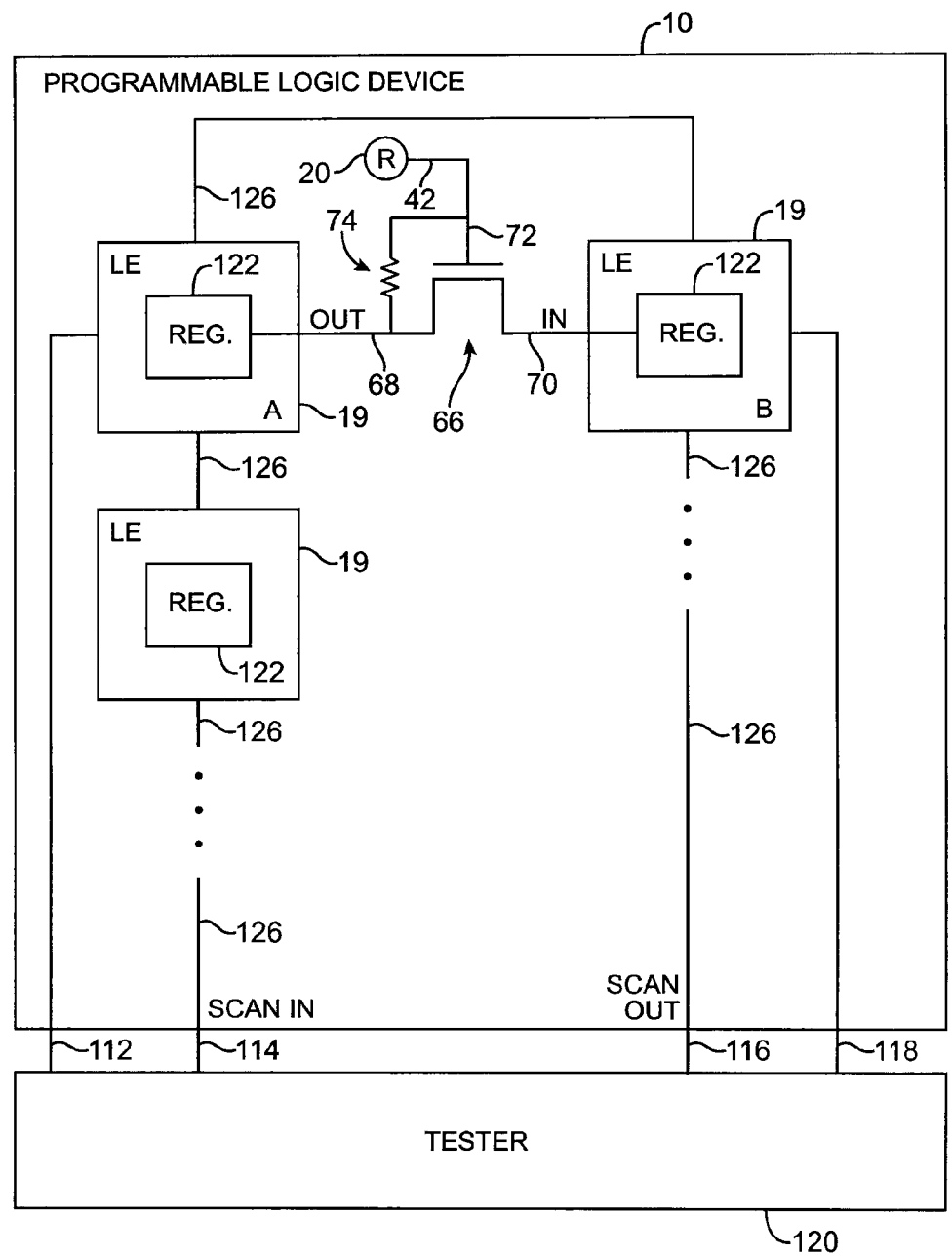
FIG. 6 is a diagram of an illustrative programmable logic device integrated circuit and tester in accordance with an embodiment of the present invention.

FIG. 6 shows an illustrative arrangement for testing CRAM arrays in accordance with the invention. A programmable logic device integrated circuit 10 or other integrated circuit under test may be connected to a tester 120 using paths such as paths 112, 114, 116, and 118. The device being tested, which is sometimes referred to as the device under test, may be an unpackaged integrated circuit such as a circuit in an undiced wafer or may be a packaged integrated circuit. Tester 120 may have an appropriate test fixture for making electrical connections with the pins 14 of device 10 during testing.

Tester 120 may be implemented using one or more personal computers, workstations, or other computers loaded with testing software. Tester 120 may perform tests based on direct user input and based on test files and other data that is supplied to tester 120 from associated computers or other external sources.

Programmable logic 18 in device 10 may contain logic elements 19. Each logic element 19 may contain a register 122. Logic elements 19 may be connected in a scan chain, using paths such as paths 126. When connected in the form of a scan chain, test data can be loaded into registers 122 through SCAN IN path 114. Test results data can be captured by registers 122 and unloaded via SCAN OUT line 116. Some test signals can be applied directly to programmable logic 18. For example, as shown schematically in FIG. 6, test data can be applied to logic elements 19 via input paths such as input path 112. Test results can be observed directly using paths such as output path 118.

The test signals that are provided to registers 122 by tester 120 are sometimes referred to as test vectors. By applying test vectors and observing corresponding test results, the tester can observe whether the configuration random-access memory elements 20 are behaving as expected. Any CRAM elements with resistive bridging at their outputs that have been sensitized for resistive bridging faults will contain erroneous values (i.e., zeros instead of ones). The erroneous states of these CRAM elements can be detected by observing the response of device 10 to test vectors, rather than reading out the contents of the CRAM array through the CRC error detection circuit 46.

Consider, as an example, the circuitry of FIG. 6. Configuration random-access memory element 20 has a resistive bridging fault at its output 42. In particular, resistive fault 74 connects gate terminal 72 of transistor 66 to source-drain terminal 68. Transistor 66 is connected between two respective logic elements 19 (in this example).

As part of a set of test configuration data that is loaded into CRAM array 22 (FIG. 2), tester 120 can load a logic one into CRAM element 20 of FIG. 6. In the absence of a resistive bridging fault at the output of configuration random-access memory element 20, the logic one in element 20 would be conveyed to the gate terminal 72 of transistor 66, turning transistor 66 on and connecting source-drain terminal 68 to source-drain terminal 70. Thus, if no fault is present, gate terminal 72 will be high turning transistor 66 on. With transistor 66 on, source-drain terminals 68 and 70 will be connected to each other. If the tester places a logic one (or zero) in logic element A, logic element B will detect this logic one (or zero).

However, when a resistive bridging fault such as fault 74 is present, the logic one that is loaded into element 20 flips to a logic zero. As a result, gate terminal 72 is high and transistor 66 is off. With transistor 66 off, source-drain terminals 68 and 70 are not electrically connected to each other. This blocks signals at the output of logic element A so that they are not detected at the input to logic element B.

Provided that the configuration random-access memory element 20 has been sensitized properly, tester 120 can detect the presence of resistive faults such as fault 74 by applying appropriate test vectors and observing the corresponding test results to determine whether programmable logic such as transistor 66 of FIG. 6 is performing as expected.

Figure 7:
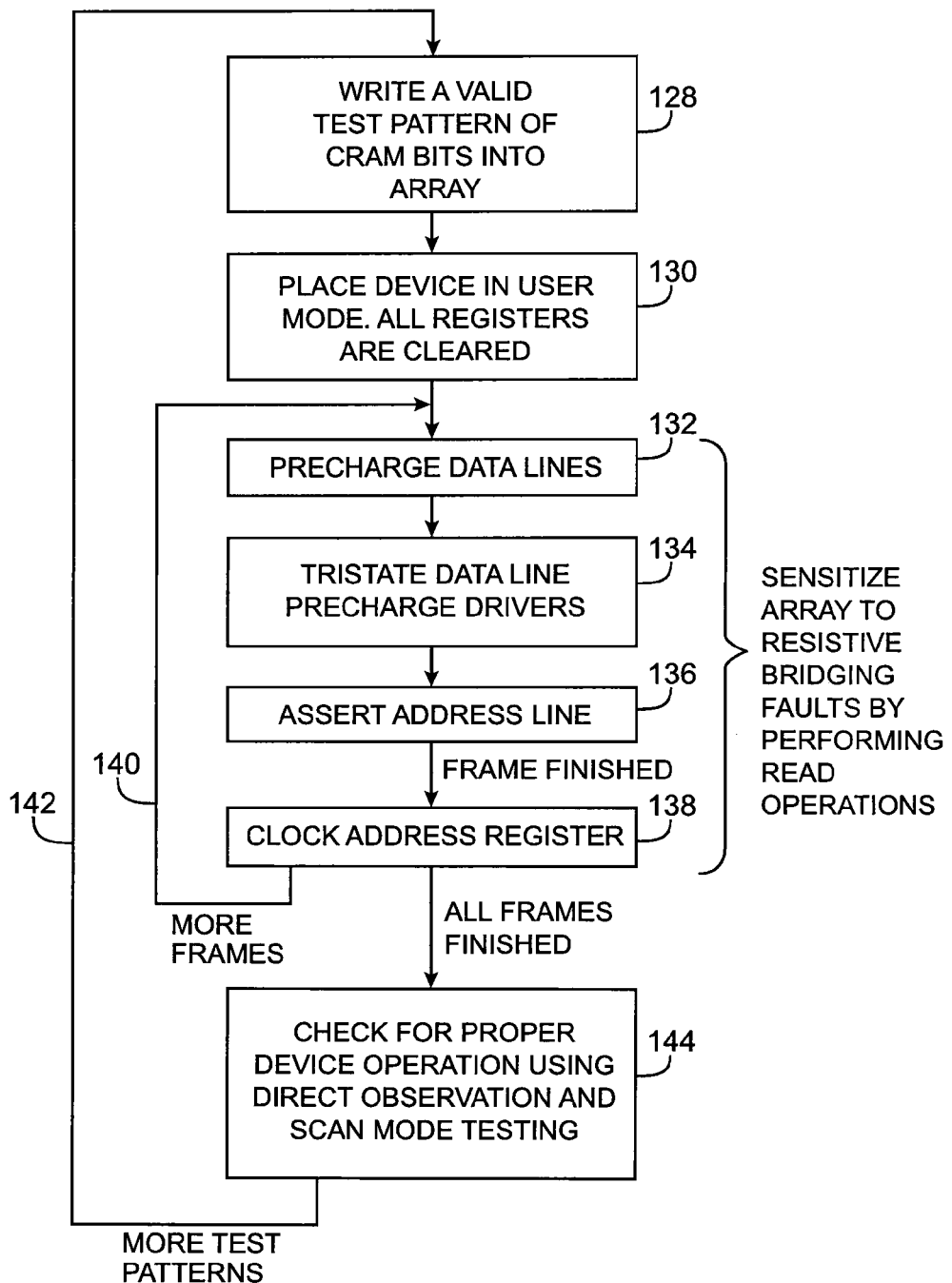
FIG. 7 is a flow chart of illustrative steps involved in testing configuration random-access memory for faults in accordance with an embodiment of the present invention.

Illustrative steps involved in testing configuration random-access memory on a programmable logic device integrated circuit are shown in FIG. 7.

At step 128, tester 120 is used to write a valid test pattern of configuration random-access memory bits into CRAM array 22 on programmable logic device integrated circuit 10. Some of the configuration random-access memory bits may be ones and some may be zeros. The test pattern may be supplied using a pin 14 and input 32 (FIG. 2) to load test configuration data into data register 30. The data in data register 30 may then be loaded into a column of memory elements 20 in array 22 by asserting one of the address lines 28. This process may be repeated until all of the elements 20 of array 22 have been loaded.

At step 130, tester 120 may place programmable logic device 10 in user mode (e.g., by applying control signals to device 10 via one or more pins 14). In user mode, all logic element registers 122 are cleared and contain a logic zero. This sets internal nodes such as node 68 in FIGS. 3 and 6 to zero.

After the logic element registers have been cleared, the configuration random-access memory elements 20 are sensitized to the presence of resistive bridging faults at their outputs. The CRAM elements are sensitized during the operations of steps 132, 134, and 136.

At step 132, precharge drivers such as precharge driver 62 of FIG. 3 are used to precharge the data lines such as data line 26. The operation of precharge driver 62 may be controlled by the PRECHARGE control signal on path 64. During precharge step 132, data lines 26 are taken to a suitable known voltage level (e.g., lines 26 are taken to a logic high such as voltage Vcc).

At step 134, the precharge drivers are tristated using PRECHARGE control lines 64.

At step 136, the address line associated with a particular column (frame) of CRAM array 22 is asserted. If one of the CRAM elements 20 that has been loaded with a logic one has an associated resistive bridging fault at its output, the state of that CRAM element will flip from its proper high value to an erroneous low value. The process of sensitizing a frame of array 22 using steps 132, 134, and 136 therefore causes CRAM elements in that frame with resistive bridging faults to flip their state to an erroneous value, provided that the resistance of the resistive bridging faults is sufficiently low (e.g., lower than resistance R2 of FIG. 4).

At step 138, the value of the current address is incremented by clocking address register 34 (FIG. 2).

If more frames in the array remain to be processed, processing loops back to step 132, as shown by line 140.

Once all of the CRAM elements 20 in array 22 have been sensitized, the tester can test the programmable logic device 10 to detect faults (step 144). The operations of step 144 may be performed immediately after the array has been sensitized to resistive bridging faults by performing all of the desired read operations of steps 132, 134, and 136 with no intervening error correction code (ECC) error detection steps such as the CRC error detection processing steps 100 and 102 of FIG. 5. By bypassing the CRC error detection process and testing the array immediately after sensitizing the array, test time can be reduced significantly.

As described in connection with FIG. 6, during the testing operations of step 144, tester 120 may use scan chain testing and direct observation techniques to apply test vectors to the programmable logic 18 of device 10 and to observe corresponding test results. The testing process of step 144 allows the tester to determine whether any transistors such as transistor 66 of FIG. 6 have been placed into an erroneous state by application of a corresponding erroneous configuration bit from a configuration random-access memory element 20 with a resistive bridging fault at its output. The operations of step 144 can therefore be used to ensure that device 10 and array 22 are operating properly.

If desired, tests can be performed using a number of different sets of valid test configuration data patterns, as indicated by line 142.

The foregoing is merely illustrative of the principles of this invention and various modifications can be made by those skilled in the art without departing from the scope and spirit of the invention.

What is claimed is:

1. A method for testing an array of configuration random-access memory elements on a programmable logic device for the presence of resistive bridging faults at their outputs, comprising:

writing test configuration data into the configuration random-access memory elements;

clearing programmable logic registers on the programmable logic device;

sensitizing the array to resistive bridging faults by performing read operations on the configuration random-access memory elements; and applying test vectors to the programmable logic registers and observing corresponding test results to determine whether any of the sensitized configuration random-access memory elements have associated resistive bridging faults.

2. The method defined in claim 1 wherein applying the test vectors comprises checking the array for proper operation immediately after sensitizing the array without performing any intervening error correction code error detection operations on the test configuration data.

3. The method defined in claim 1 wherein applying the test vectors comprises checking the array for proper operation immediately after sensitizing the array without performing any intervening cyclic redundancy check error detection operations on the test configuration data.

4. The method defined in claim 1 wherein the array has an associated data register and wherein applying the test vectors comprises checking the array for proper operation immediately after sensitizing the array without performing any intervening data shifting operations using the data register.

5. The method defined in claim 1 wherein the programmable logic device has input-output pins, wherein applying the test vectors comprises checking the array for proper operation using direct observation immediately after sensitizing the array without performing any intervening error correction code error detection operations on the test configuration data, and wherein using direct observation comprises:

with a tester, applying at least part of the test vectors to at least some of the input-output pins while observing the test results on at least some of the input-output pins.

6. The method defined in claim 1 wherein applying the test vectors comprises checking the array for proper operation using scan chain testing immediately after sensitizing the array without performing any intervening error correction code error detection operations on the test configuration data.

7. The method defined in claim 1, wherein applying the test vectors comprises checking the array for proper operation using scan chain testing immediately after sensitizing the array without performing any intervening error correction code error detection operations on the test configuration data and wherein using scan chain testing comprises:

with a tester, applying at least part of the test vectors using a scan chain formed from at least some of the programmable logic registers.

8. The method defined in claim 1 wherein applying the test vectors comprises checking the array for proper operation using scan chain testing immediately after sensitizing the array without performing any intervening error correction code error detection operations on the test configuration data and wherein using scan chain testing comprises:

with a tester, observing at least part of the test results using a scan chain formed from at least some of the programmable logic registers.

9. The method defined in claim 1 wherein the array comprises data lines and wherein sensitizing the array comprises precharging the data lines.

10. The method defined in claim 1 wherein the array comprises data lines and precharge drivers that drive the data lines and wherein sensitizing the array comprises:

precharging the data lines with the precharge drivers; and tristating the precharge drivers after precharging the data lines.

11. The method defined in claim 1 wherein the array comprises data lines, precharge drivers that drive the data lines, and address lines and wherein sensitizing the array comprises:
  precharging the data lines with the precharge drivers;
  tristating the precharge drivers after precharging the data lines; and
  systematically asserting the address lines to read from the array after tristating the precharge drivers.

12. The method defined in claim 1 wherein the programmable logic comprises metal-oxide-semiconductor transistors having gates and wherein the configuration random-access memory elements each include:
  an address transistor;
  a clear transistor;
  an output line that is coupled to the gate of a respective one of the programmable logic metal-oxide-semiconductor transistors; and
  a pair of cross-coupled inverters having an inverted data node that is connected to the address transistor and a data node that is connected to the clear transistor and the output line, wherein applying test vectors to the programmable logic registers comprises applying test vectors to the programmable logic registers to determine whether unwanted resistive paths are present that bridge the gates of any of the metal-oxide-semiconductor transistors.

13. A method for testing an array of configuration random-access memory elements on a programmable logic device for the presence of resistive bridging faults at their outputs, wherein the programmable logic device comprises programmable logic that includes metal-oxide-semiconductor transistors having gates and that includes programmable logic registers, and wherein the configuration random-access memory elements each include an address transistor, a clear transistor, an output line that is coupled to the gate of a respective one of the programmable logic metal-oxide-semiconductor transistors, and a pair of cross-coupled inverters having an inverted data node that is connected to the address transistor and a data node that is connected to the clear transistor and the output line, the method comprising the steps of:
  sensitizing the array to resistive bridging faults by performing read operations on the configuration random-access memory elements; and
  applying test vectors to the programmable logic registers and observing corresponding test results to determine whether any one of the sensitized configuration random-access memory elements has an associated resistive bridging fault that bridges the gate of the metal-oxide-semiconductor transistor that is coupled to its output line.

14. The method defined in claim 13 further comprising:
  before sensitizing the array, writing test configuration data into the configuration random-access memory elements and clearing the programmable logic registers on the programmable logic device.

15. The method defined in claim 13 further comprising:
  before sensitizing the array, placing the programmable logic device in user mode to clear the programmable logic registers on the programmable logic device, wherein applying the test vectors to the programmable logic registers and observing corresponding test results to determine whether any one of the sensitized configuration random-access memory elements has an associated resistive bridging fault comprises applying the test vectors to the programmable logic registers and observing corresponding test results to determine whether any one of the sensitized configuration random-access memory elements has an associated resistive bridging fault that can only be detected in the user mode.

16. The method defined in claim 13 wherein applying test vectors to the programmable logic registers and observing corresponding test results comprises applying test vectors to the programmable logic registers and observing corresponding test results immediately after sensitizing the array without performing any intervening error correction code error detection operations.

17. The method defined in claim 13 wherein applying test vectors to the programmable logic registers and observing corresponding test results comprises checking whether the metal-oxide-semiconductor transistors have been turned on and off as expected by the configuration random-access memory elements.

18. The method defined in claim 13 wherein applying test vectors to the programmable logic registers and observing corresponding test results comprises using scan chain testing to check whether the metal-oxide-semiconductor transistors have been turned on and off as expected by the configuration random-access memory elements.

19. The method defined in claim 13 wherein applying test vectors to the programmable logic registers and observing corresponding test results comprises using direct observation testing in which test signals are applied and test results are observed through input-output pins to check whether the metal-oxide-semiconductor transistors have been turned on and off as expected by the configuration random-access memory elements.

20. The method defined in claim 13 wherein the array comprises data lines, precharge drivers that drive the data lines, and address lines, wherein the data lines are connected to the address transistors, wherein the address transistors each have an address transistor gate, wherein the address lines are each connected to a respective one of the address transistor gates, and wherein sensitizing the array comprises:
  precharging the data lines with the precharge drivers;
  tristating the precharge drivers; and
  systematically asserting the address lines to read from the array.

* * * * *